(12) United States Patent
Unokuchi

(10) Patent No.: US 6,457,759 B1
(45) Date of Patent: Oct. 1, 2002

(54) ADSORPTION PEN IMPROVED IN OPERABILITY

(75) Inventor: Fukumi Unokuchi, Kumamoto (JP)

(73) Assignee: NEC Corporation, Tokyo (JP)

(*) Notice: Subject to any disclaimer, the term of this patent is extended or adjusted under 35 U.S.C. 154(b) by 9 days.

(21) Appl. No.: 09/686,066

(22) Filed: Oct. 11, 2000

(30) Foreign Application Priority Data

Oct. 13, 1999 (JP) ............................................ 11-291081

(51) Int. Cl.[7] .............................................. B25J 15/06
(52) U.S. Cl. ..................................................... 294/64.1
(58) Field of Search ............................... 294/64.1, 64.2, 294/64.3, 65, 907; 414/627, 737, 752.1; 901/40

(56) References Cited

U.S. PATENT DOCUMENTS

| | | | | |
|---|---|---|---|---|
| 2,303,393 A | * | 12/1942 | Schmidt | 294/64.1 |
| 2,607,620 A | * | 8/1952 | Oliveri | 294/64.1 |
| 3,307,113 A | * | 2/1967 | Hutchison | 294/64.1 |
| 3,337,897 A | * | 8/1967 | Lerner et al. | 294/64.1 |
| 3,716,307 A | * | 2/1973 | Hansen | 294/64.2 |
| 3,759,560 A | * | 9/1973 | Yoda et al. | 294/64.1 |
| 3,833,230 A | * | 9/1974 | Noll | 394/64.1 |
| 3,834,558 A | * | 9/1974 | Bru | 294/64.1 |
| 4,548,396 A | * | 10/1985 | Nelen | 294/64.1 |
| 4,593,947 A | * | 6/1986 | Yocum | 294/64.1 |
| 4,763,941 A | * | 8/1988 | Sniderman | 414/627 |
| 4,858,976 A | * | 8/1989 | Stoll | 294/64.1 |
| 4,950,011 A | * | 8/1990 | Borcea et al. | 294/64.1 |
| 5,193,776 A | * | 3/1993 | Nagai et al. | 294/64.1 |
| 5,213,385 A | * | 5/1993 | Nagai et al. | 294/64.1 |
| 5,799,994 A | * | 9/1998 | Tsai et al. | 294/64.1 |
| 5,928,537 A | * | 7/1999 | Fortune | 294/64.1 |
| 6,213,528 B1 | * | 4/2001 | Hulken et al. | 294/64.1 |
| 6,287,071 B1 | * | 9/2001 | Hsieh et al. | 294/64.1 |
| 6,318,777 B1 | * | 11/2001 | Tanaka et al. | 294/64.1 |

FOREIGN PATENT DOCUMENTS

| | | | | |
|---|---|---|---|---|
| CH | 0361383 | * | 5/1962 | 294/64.1 |
| DE | 0396668 | * | 6/1924 | 294/64.1 |
| DE | 3923672 | * | 5/1990 | 294/64.1 |
| FR | 2511921 | * | 3/1983 | 294/64.1 |
| GB | 1194669 | * | 6/1970 | 294/64.1 |
| JP | 405177556 | * | 7/1993 | 294/64.1 |
| JP | 5-267433 | | 10/1993 | |
| JP | 10-329488 | | 12/1998 | |
| SU | 0800092 | * | 2/1981 | 294/64.3 |

* cited by examiner

Primary Examiner—Eileen D. Lillis
Assistant Examiner—Paul T. Chin
(74) Attorney, Agent, or Firm—Young & Thompson

(57) ABSTRACT

An adsorption pen for adsorbing and releasing an article includes a body. A contact head is coupled with the body and has an adsorption pad in contact with the article for forming an internal space defined by the adsorption pad and the article. The adsorption pad has at least a bendable and contractible elastic portion which is deformable to reduce a volume of the internal space, thereby to reduce an internal pressure of the internal space upon application of a pushing force to the body toward the article. A valve mechanism switches the internal space between a closed-state where the internal space is separated by the valve mechanism from the atmospheric pressure and an open-state where the internal space has the atmospheric pressure. A knock mechanism connected to the valve mechanism places the valve mechanism into the closed-state upon both operations of applying a pushing force to the body toward the article and subsequently making the body free from application of the pushing force, so that the adsorption pad adsorbs the article due to the reduced internal pressure of the internal force and also places the valve mechanism into the open-state upon applying the pushing force to the body again, so that the adsorption pad releases the article.

10 Claims, 5 Drawing Sheets

ADSORPTION PEN IMPROVED IN OPERABILITY

BACKGROUND OF THE INVENTION

The present invention relates to an adsorption pen, and more particularly to an adsorption pen improved in operability for handling wafers, pellets cut from a wafer and IC packages with sealed pellets.

In the processes for manufacturing various semiconductor devices, the adsorption pen is used for handling wafers, pellets cut from a wafer and IC packages with sealed pellets. In Japanese laid-open patent publication No. 6-163672, it is disclosed that the conventional adsorption pen has the following structure. FIG. 1 is a cross sectional elevation view illustrative of the conventional adsorption pen disclosed in the above publication. The conventional adsorption pen has a body 300 and a head 400 extending from the body 300. The head 400 has an adsorption port 21 which is in contact with the object which is intended to be adsorbed. The body 300 has a cylinder 23 which is connected through a passage 22 to the adsorption port 21 in the head 400. The cylinder 23 has a piston 24, a piston rod 26, and a contraction spring 25. A first face of the piston 24 faces toward the passage 22 and the adsorption port 21, whilst a second face of the piston 24 is connected with the piston rod 26. The contraction spring 25 has a first end which is fixed to the second face of the piston 24 and a second end which is fixed to a bottom end of the cylinder 23. The contraction spring 25 provides a contracting force which forces the piston 24 toward the bottom end of the cylinder 23. The body 300 further has a ratchet stopper mechanism which comprises a pair of ratchet stoppers 28a, a pair of levers 29, 30 and a single push button 31. Each of the ratchet stoppers 28a has an alignment of plural ratchets in parallel to the piston rod 26. Each of the ratchet stoppers 28a is connected to the piston rod 26 fixed to the piston 24, so that the ratchet stoppers 28a show coupling motions to the piston rod 26 fixed to the piston 24. Each of the levers 29, 30 has a first end connected to the push button 31 and a second end having a ratchet 28b which is engaged with any one of the plural ratchets of the ratchet stoppers 28a when the push button 31 is not pushed, so that the engagement of the ratchets 28b of the levers 29, 30 with the ratchets of the ratchet stoppers 28a stops the motion of the piston rod 26 fixed to the piston 24 toward the bottom of the cylinder 23 even though the contraction spring 25 remains to provide a contracting force which forces the piston 24 toward the bottom end of the cylinder 23. If the push button 31 is pushed, the ratchets 28b of the levers 29, 30 are disengaged from the ratchets of the ratchet stoppers 28a to allow motion of the piston rod 26 fixed to the piston 24 toward the bottom of the cylinder 23 due to the contracting force by the contraction spring 25, whereby a cylinder internal space is formed which is defined by an inner wall of the cylinder 23 and the first face of the piston 24, and thus the adsorption port 21, the passage 22 and the cylinder internal space are placed into a vacuum state. One push of the push button 31 disengages one of the ratchets of the ratchet stopper 28a from the ratchet 28b connected with the lever 29 thereby to move the piston rod 26 and the piston 24 toward the bottom end of the cylinder 23 by the contracting force by the contraction spring 25 but subsequently and automatically the next one of the ratchets of the ratchet stopper 28a is then engaged with the ratchet 28b connected with the lever 29 thereby to stop the motion of the piston rod 26 and the piston 24. Further, the body 300 has a handle 27 at its bottom portion for handling the adsorption pen.

The conventional adsorption pen is disadvantageous in the following viewpoint. It is necessary for a user to not only grip the handle 27 but also push the push button 31 to operate the conventional adsorption pen, for which reason the conventional adsorption pen is inconvenient in operability thereof. This disadvantage in inconvenient operability is likely to cause miss-operations of the conventional adsorption pen in adsorption and release to an object to be adsorbed such as wafers, pellets cut from a wafer and IC packages with sealed pellets. This object will hereinafter be referred to as "work". Once the conventional adsorption pen is miss-operated in adsorption and release to the work, it is possible to drop the work and break the same.

In the above circumstances, it had been required to develop a novel adsorption pen free from the above problem.

SUMMARY OF THE INVENTION

Accordingly, it is an object of the present invention to provide a novel adsorption pen free from the above problems.

It is a further object of the present invention to provide a novel adsorption pen which is convenient in operability.

The present invention provides an adsorption pen for adsorbing and releasing an article comprising: a body; a contact head coupled with the body and having an adsorption pad being in contact tightly with the article for forming an internal space defined by the adsorption pad and the article, and the adsorption pad having at least a bendable and contractible elastic portion which is deformable to reduce a volume of the internal space, thereby to reduce an internal pressure of the internal space upon application of a pushing force to the body toward the article; a valve mechanism for switching the internal space between a close-state where the internal space is separated by the valve mechanism from the atmospheric pressure and an open-state where the internal space has the atmospheric pressure; and a knock mechanism connected to the valve mechanism for placing the valve mechanism into the close-state upon both operations of applying a pushing force to the body toward the article and subsequently making the body free from application of the pushing force, so that the adsorption pad adsorbs the article due to the reduced internal pressure of the internal force and also for placing the valve mechanism into the open-state upon applying the pushing force to the body again, so that the adsorption pad releases the article.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1:
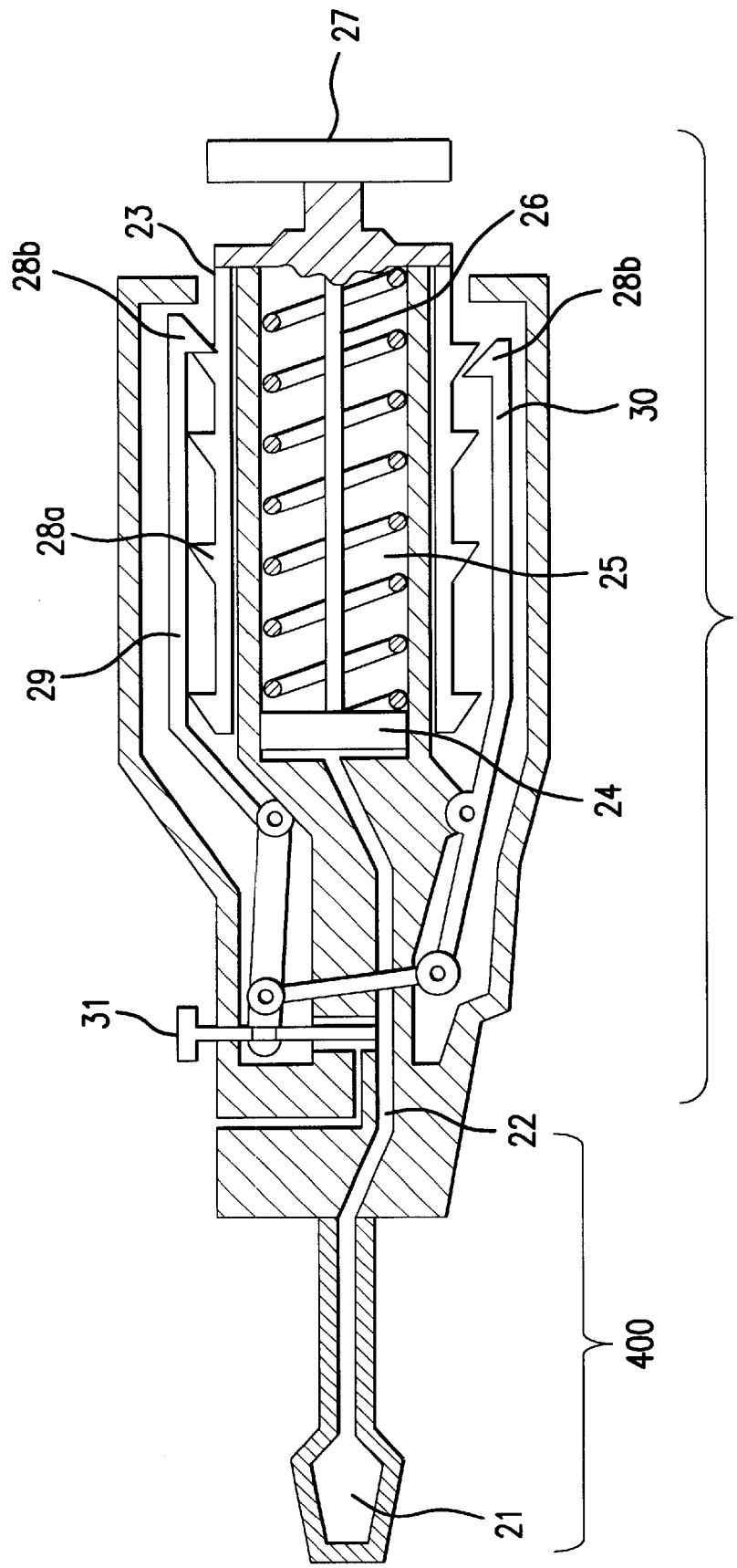
FIG. 1 is a cross sectional elevation view illustrative of the conventional adsorption pen disclosed in the above publication.

The first present invention provides an adsorption tool for adsorbing and releasing an article comprising: a contact head being in contact tightly with the article for forming an internal space defined by the contact head and the article; a body coupled with the contact head; and a pressure-adjuster accommodated in the adsorption tool for reducing an internal pressure of the internal space from an atmospheric pressure upon both operations of applying a pushing force to the body toward the article and subsequently making the body free from application of the pushing force, so that the contact head adsorbs the article due to the reduced internal pressure of the internal force and also for returning the internal pressure of the internal space to an atmospheric pressure upon applying the pushing force to the body again, so that the contact head releases the article.

It is preferable that the adsorption tool is in a form of a pen.

It is also preferable that the contact head has an adsorption pad which has at least a bendable and contractible elastic portion which is deformable to reduce a volume of the internal space, thereby to reduce the internal pressure of the internal space upon application of the pushing force to the body toward the article.

It is also preferable that the pressure-adjuster further comprises: a valve mechanism for switching the internal space between a close-state where the internal space is separated by the valve mechanism from the atmospheric pressure and an open-state where the internal space has the atmospheric pressure; and a knock mechanism connected to the valve mechanism for placing the valve mechanism into the close-state upon both operations of applying a pushing force to the body toward the article and subsequently making the body free from application of the pushing force, so that the contact head adsorbs the article due to the reduced internal pressure of the internal force and also for placing the valve mechanism into the open-state upon applying the pushing force to the body again, so that the contact head releases the article.

It is further preferable that the valve mechanism further comprises: a valve seat provided at an inner-most part of the internal space; a valve provided close to the valve seat; a valve rod terminated with the valve and held by the knock mechanism, so that the knock mechanism makes the valve apart from the valve seat upon applying the pushing force to the body toward the article and the knock mechanism makes the valve into contact with the valve seat upon making the body free from application of the pushing force.

It is further more preferable that the body comprises an enclosure member having an inner wall having plural projecting keys, and the valve rod has a stepped portion as well as the knock mechanism further comprises: a rotational lock member having plural first key grooves for receiving the plural keys of the enclosure member and at least a first ratchet, and the rotational lock member having a bottom being engagable with the stepped portion of the valve rod for receiving a force toward the first ratchet; a lock operational member having plural second key grooves for receiving the plural keys of the enclosure member and at least a second ratchet for being engaged with the first ratchet of the rotational lock member; a first coil-spring member provided between the contact head and the enclosure member for applying a first spring force to the enclosure member in an anti-parallel direction toward the contact head; and a second coil-spring member provided between a spring seat of the valve rod and a bottom of the enclosure member for applying a second spring force to the spring seat so that the valve rod is forced toward the first ratchet through the stepped portion of the valve rod.

The adsorption tool may be used for adsorbing and releasing an article which is any one of wafers, pellets cut from a wafer and IC packages with sealed pellets, wherein the adsorption tool has the structure as described above.

The second present invention provides an adsorption tool for adsorbing and releasing an article comprising: a body; a contact head coupled with the body and having an adsorption pad being in contact tightly with the article for forming an internal space defined by the adsorption pad and the article, and the adsorption pad having at least a bendable and contractible elastic portion which is deformable to reduce a volume of the internal space, thereby to reduce an internal pressure of the internal space upon application of a pushing force to the body toward the article; and a pressure-adjuster accommodated in the adsorption tool for reducing the internal pressure of the internal space from an atmospheric pressure upon both operations of applying a pushing force to the body toward the article and subsequently making the body free from application of the pushing force, so that the adsorption pad adsorbs the article due to the reduced internal pressure of the internal force and also for returning the internal pressure of the internal space to an atmospheric pressure upon applying the pushing force to the body again, so that the adsorption pad releases the article.

It is preferable that the adsorption tool is in a form of a pen.

It is further preferable that the pressure-adjuster further comprises: a valve mechanism for switching the internal space between a close-state where the internal space is separated by the valve mechanism from the atmospheric pressure and an open-state where the internal space has the atmospheric pressure; and a knock mechanism connected to the valve mechanism for placing the valve mechanism into the close-state upon both operations of applying a pushing force to the body toward the article and subsequently making the body free from application of the pushing force, so that the adsorption pad adsorbs the article due to the reduced internal pressure of the internal force and also for placing the valve mechanism into the open-state upon applying the pushing force to the body again, so that the adsorption pad releases the article.

It is further more preferable that the valve mechanism further comprises: a valve seat provided at an inner-most part of the internal space; a valve provided close to the valve seat; and a valve rod terminated with the valve and held by the knock mechanism, so that the knock mechanism makes the valve apart from the valve seat upon applying the pushing force to the body toward the article and the knock mechanism makes the valve into contact with the valve seat upon making the body free from application of the pushing force.

It is moreover preferable that the body comprises an enclosure member having an inner wall having plural projecting keys, and the valve rod has a stepped portion as well as the knock mechanism further comprises: a rotational lock member having plural first key grooves for receiving the plural keys of the enclosure member and at least a first ratchet, and the rotational lock member having a bottom being engagable with the stepped portion of the valve rod for receiving a force toward the first ratchet; a lock operational member having plural second key grooves for receiving the plural keys of the enclosure member and at least a second ratchet for being engaged with the first ratchet of the rotational lock member; a first coil-spring member provided between the adsorption pad and the enclosure member for applying a first spring force to the enclosure member in an anti-parallel direction toward the adsorption pad; and a second coil-spring member provided between a spring seat of the valve rod and a bottom of the enclosure member for applying a second spring force to the spring seat so that the valve rod is force toward the first ratchet through the stepped portion of the valve rod.

The third present invention provides an adsorption pen for adsorbing and releasing an article comprising: a body; a contact head coupled with the body and having an adsorption pad being in contact tightly with the article for forming an internal space defined by the adsorption pad and the article, and the adsorption pad having at least a bendable and contractible elastic portion which is deformable to reduce a volume of the internal space, thereby to reduce an internal pressure of the internal space upon application of a pushing force to the body toward the article; a valve mechanism for switching the internal space between a close-state where the internal space is separated by the valve mechanism from the atmospheric pressure and an open-state where the internal space has the atmospheric pressure; and a knock mechanism connected to the valve mechanism for placing the valve mechanism into the close-state upon both operations of applying a pushing force to the body toward the article and subsequently making the body free from application of the pushing force, so that the adsorption pad adsorbs the article due to the reduced internal pressure of the internal force and also for placing the valve mechanism into the open-state upon applying the pushing force to the body again, so that the adsorption pad releases the article.

It is preferable that the valve mechanism further comprises: a valve seat provided at an inner-most part of the internal space; a valve provided close to the valve seat; and a valve rod terminated with the valve and held by the knock mechanism, so that the knock mechanism makes the valve apart from the valve seat upon applying the pushing force to the body toward the article and the knock mechanism makes the valve into contact with the valve seat upon making the body free from application of the pushing force.

It is further preferable that the body comprises an enclosure member having an inner wall having plural projecting keys, and the valve rod has a stepped portion as well as the knock mechanism further comprises: a rotational lock member having plural first key grooves for receiving the plural keys of the enclosure member and at least a first ratchet, and the rotational lock member having a bottom being engagable with the stepped portion of the valve rod for receiving a force toward the first ratchet; a lock operational member having plural second key grooves for receiving the plural keys of the enclosure member and at least a second ratchet for being engaged with the first ratchet of the rotational lock member; a first coil-spring member provided between the adsorption pad and the enclosure member for applying a first spring force to the enclosure member in an anti-parallel direction toward the adsorption pad; and a second coil-spring member provided between a spring seat of the valve rod and a bottom of the enclosure member for applying a second spring force to the spring seat so that the valve rod is forced toward the first ratchet through the stepped portion of the valve rod.

PREFERRED EMBODIMENT

Figure 2:
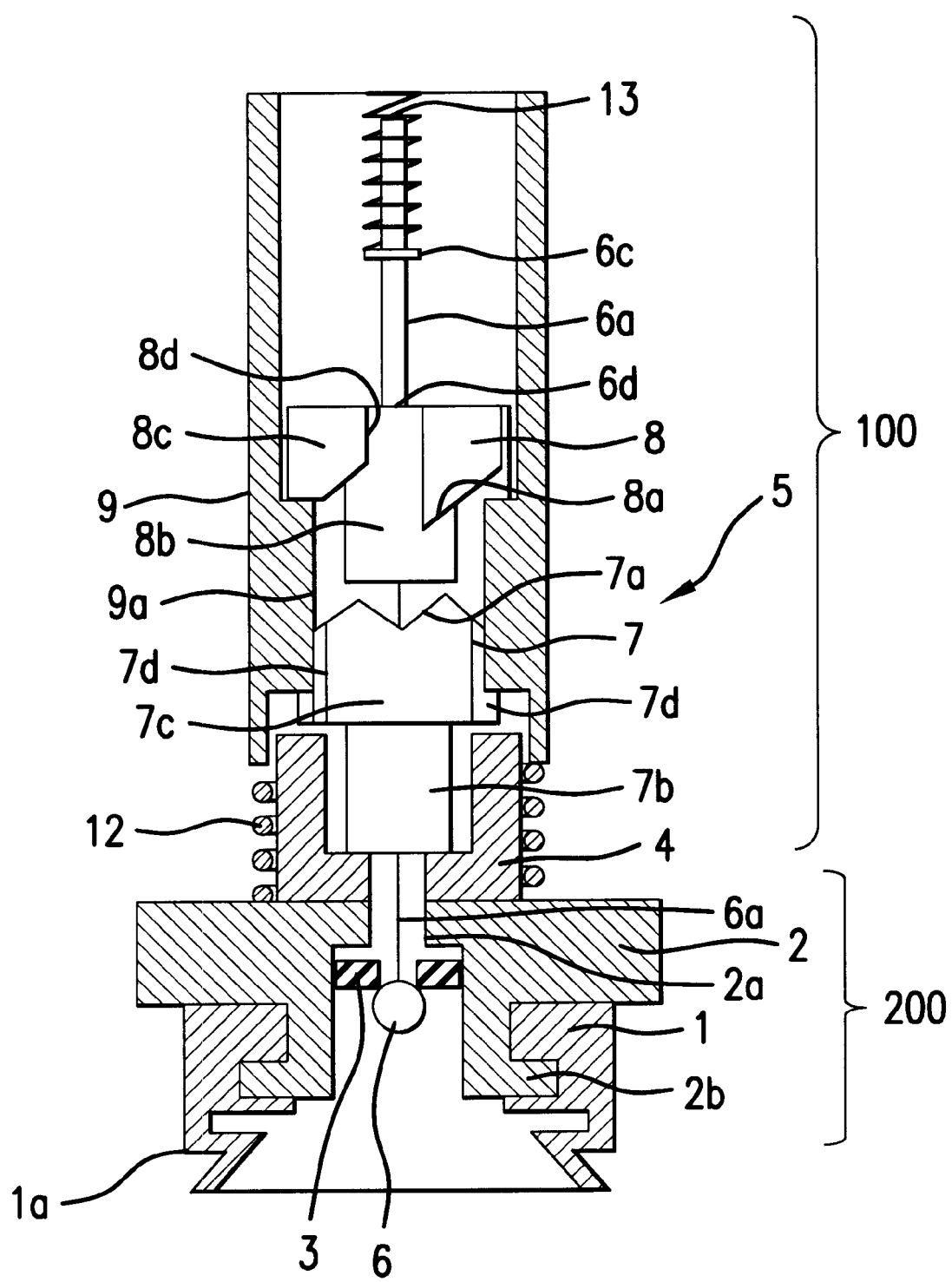
FIG. 2 is a longitudinal cross sectional elevation view illustrative of a novel adsorption pen in a preferred embodiment in accordance with the present invention.
Figure 3A:
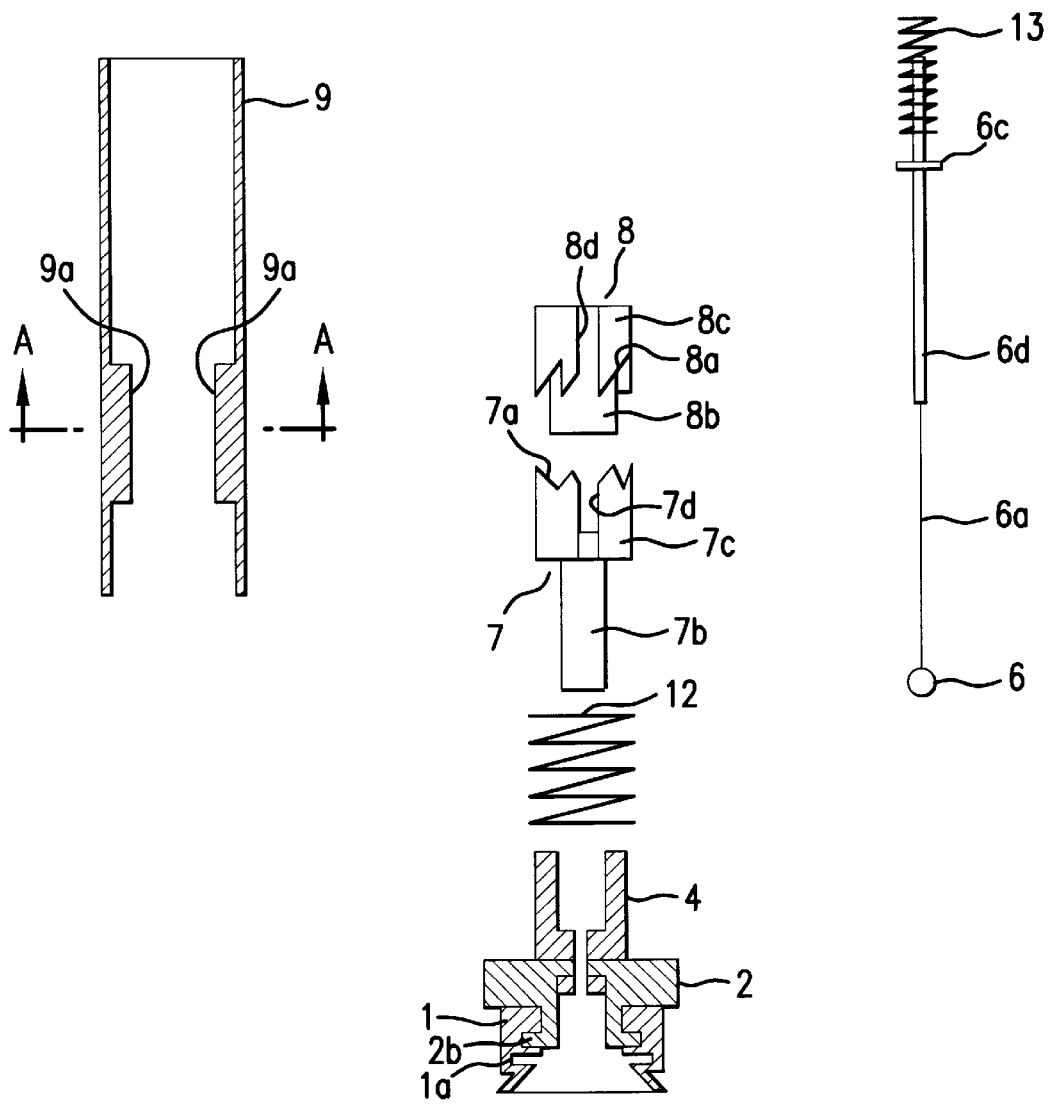
FIG. 3A is an exploded longitudinal cross sectional view illustrative of the parts of the novel adsorption pen of FIG. 2.
Figure 3B:
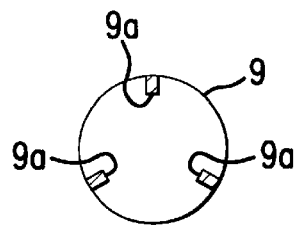
FIG. 3B is a perpendicular-cross sectional view illustrative of a cylindrically shaped operational enclosure as one part of the novel adsorption pen shown in FIG. 3A.
Figure 4:
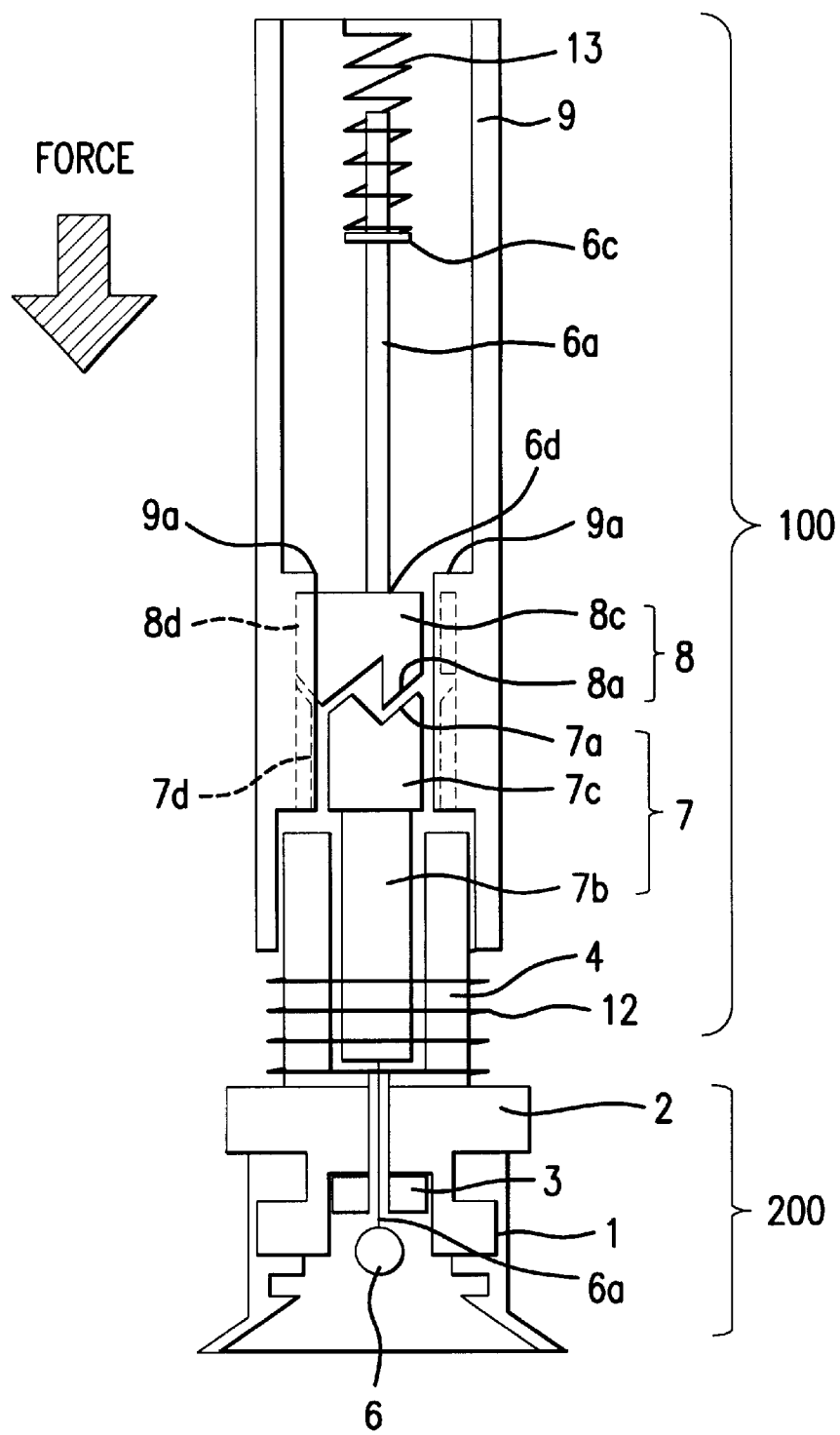
FIG. 4 is a longitudinal cross sectional elevation view illustrative of a novel adsorption pen placed in a releasing state for releasing a work to explain operations of the novel adsorption pen shown in FIG. 2.
Figure 5:
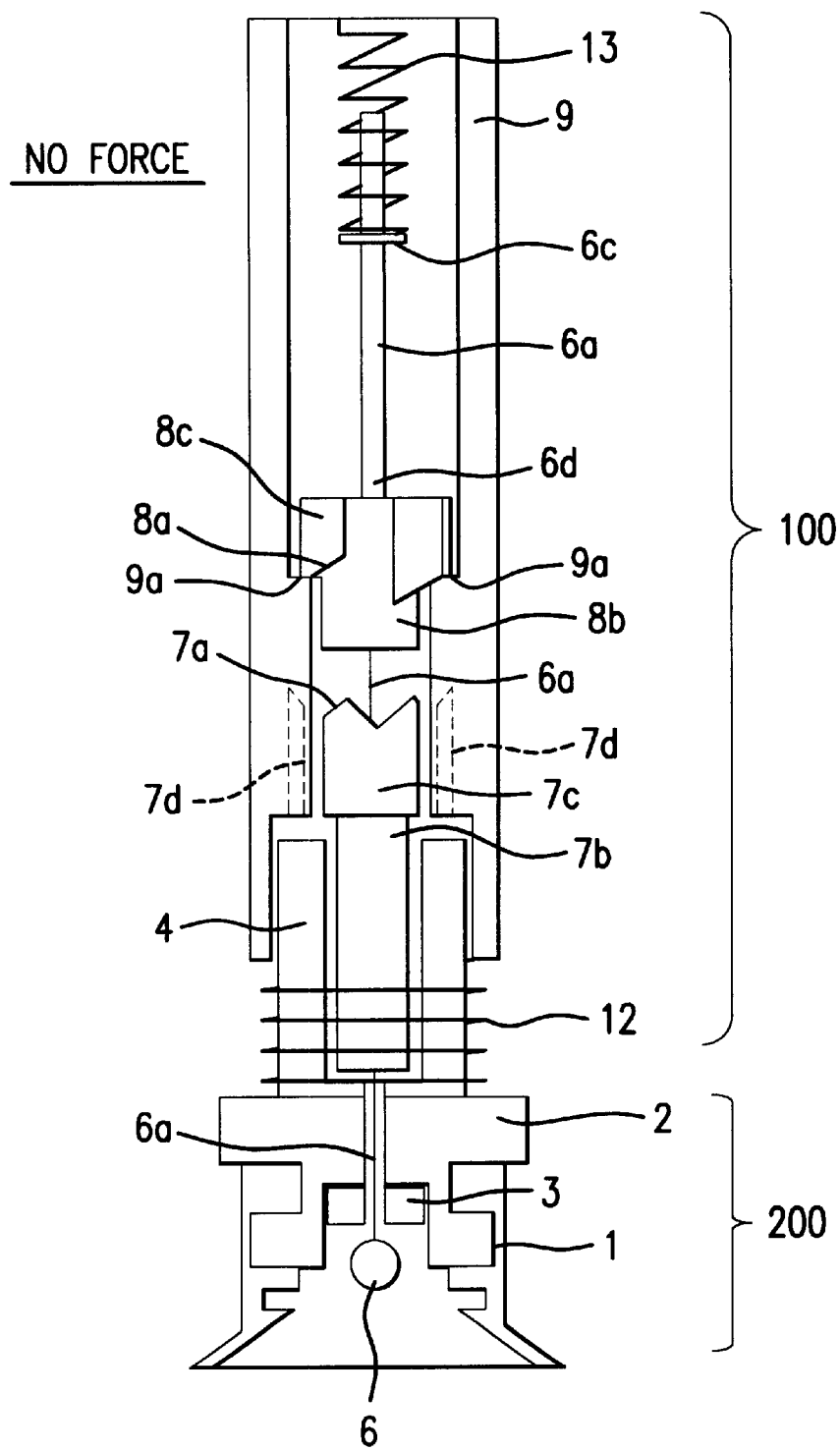
FIG. 5 is a longitudinal cross sectional elevation view illustrative of a novel adsorption pen placed in an adsorbing state for adsorbing a work to explain operations of the novel adsorption pen shown in FIG. 2.

A first embodiment according to the present invention will be described in detail with reference to the drawings. FIG. 2 is a longitudinal cross sectional elevation view illustrative of a novel adsorption pen in a preferred embodiment in accordance with the present invention. FIG. 3A is a longitudinal exploded cross sectional view illustrative of the parts of the novel adsorption pen of FIG. 2. FIG. 3B is a perpendicular-cross sectional view illustrative of a cylindrically shaped operational enclosure as one part of the novel adsorption pen shown in FIG. 3A. FIG. 4 is a longitudinal cross sectional elevation view illustrative of a novel adsorption pen placed in a releasing state for releasing a work to explain operations of the novel adsorption pen shown in FIG. 2. FIG. 5 is a longitudinal cross sectional elevation view illustrative of a novel adsorption pen placed in an adsorbing state for adsorbing a work to explain operations of the novel adsorption pen shown in FIG. 2.

As shown in FIG. 2, a novel adsorption pen has a body 100 and a head 200. The body 100 has a knock mechanism 5. The head 200 has an adsorption pad 1 and a valve 6. When the valve 6 is placed into a close state, then the adsorption pad 1 adsorbs a work. When the valve 6 is placed into an open state, then the adsorption pad 1 releases the work. The knock mechanism 5 is connected through a valve rod 6a to the valve 6. Once the adsorption pad 1 is made into contact securely with the work and pushes the work, so that the knock mechanism 5 places the valve 6 into the open state and the adsorption pad 1 is deformed to reduce the volume of the internal space of the adsorption pad 1, and subsequently the external force applied to the body 100 toward the work is discontinued, so that the knock mechanism 5 places the valve 6 into the close state and also the adsorption pad 1 is returned to the original form to increase the volume of the internal space of the adsorption pad 1, thereby reducing the internal pressure of the adsorption pad 1, whereby the adsorption pad 1 adsorbs the work. Further, if the adsorption pad 1 again pushes the work, then the knock mechanism 5 places the valve 6 into the open state, so that the internal pressure of the adsorption pad 1 is returned to the atmospheric pressure, whereby the adsorption pad 1 releases the work. Namely, simple alternating operations of pushing the adsorption pen toward the work and making the adsorption pen free causes the knock mechanism 5 to switch the valve 6 between the close and open states to allow the adsorption pad 1 to adsorb and release the work.

The detailed descriptions about the structure of the novel adsorption pen will be made. The head 200 has the adsorption pad 1 and a nozzle 2, wherein the nozzle 2 serves as a base portion which is fixed to a first end of the body 100 having the knock mechanism 5, whilst the adsorption pad 1 is supported by the nozzle 2 and is made into contact directly with the work. The adsorption pad 1 has a conically-spread contact portion which is made into contact directly with the work and a base portion which is tightly engaged with a radially extended rim 2b of the nozzle 2 to fix the adsorption pad 1 to the nozzle 2 as well as has a bendable and contractible elastic portion 1a between the base portion and the conically-spread contact portion. When the adsorption pad 1 is made into contact securely with the work and pushes the work, then the bendable and contractible elastic portion 1a of the adsorption pad 1 is elastically deformed to be bent and contracted to reduce an internal volume of the adsorption pad 1. An internal space of the body 100 is connected through a passage 2a to an internal space of the head 200, wherein the valve rod 6a extends through the passage 2a. A seat 3 is provided at a first end of the passage 2a, wherein the seat 3 has an opening through which the valve rod 6a extends. If the valve 6 is made into contact tightly with the seat 3, then the valve 6 is placed into the close state, whereby the internal space of the adsorption pad 1 is separated from the passage 2a which is connected to the internal space of the body 100 having the knock mechanism 5. If the valve 6 is separated from the seat 3, then the valve 6 is placed into the open state, whereby the internal space of the adsorption pad 1 is connected to the passage 2a which is connected to the internal space of the body 100 having the knock mechanism 5.

As described above, once the adsorption pad 1 securely contacts with the work and pushes the work, so that the knock mechanism 5 places the valve 6 into the open state and the adsorption pad 1 is deformed to reduce the volume of the internal space of the adsorption pad 1, and subsequently the external force applied to the body 100 toward the work is discontinued, so that the knock mechanism 5 places the valve 6 into the close state and also the adsorption pad 1 is returned to the original form to increase the volume of the internal space of the adsorption pad 1, thereby reducing the internal pressure of the adsorption pad 1, whereby the adsorption pad 1 adsorbs the work. Further, if the adsorption pad 1 again pushes the work, then the knock mechanism 5 places the valve 6 into the open state, so that the internal pressure of the adsorption pad 1 is returned to the atmospheric pressure, whereby the adsorption pad 1 releases the work. Namely, simple alternating operations of pushing the adsorption pen toward the work and making the adsorption pen free causes the knock mechanism 5 to switch the valve 6 between the close and open states to allow the adsorption pad 1 to adsorb and release the work. The body 100 has a cylinder head 4 fixed to the nozzle 2 and a cylinder-shaped enclosure 9 coupled to the cylinder head 4 as well as a first coil-spring member 12 which extends around the cylinder head 4 between the nozzle 2 and the cylinder-shaped enclosure 9. The first coil-spring member 12 provides an elastic force applied to both the nozzle 2 and the cylinder-shaped enclosure 9, so that the cylinder-shaped enclosure 9 is distanced form the nozzle 2. If the adsorption pad 1 securely contacts with the work and the cylinder-shaped enclosure 9 is forced toward the work with an exceeding force over the spring force by the first coil-spring member 12, then the first coil-spring member 12 is compressed to apply the spring force to the head 200, whereby the adsorption pad 1 is made into tightly contact with the work, and concurrently the bendable and contractible elastic portion 1a of the adsorption pad 1 is elastically deformed to be bent and contracted to reduce an internal volume of the adsorption pad 1. The cylinder head 4 and the cylinder-shaped enclosure 9 form an internal space which accommodates the knock mechanism 5 and the valve rod 6a. The valve rod 6a has a first end terminated with the valve 6 and a second end terminated with a spring seat 6c. A second coil-spring member 13 is provided which extends between the spring seat 6c and a bottom of the cylinder-shaped enclosure 9 of the body 100. The valve rod 6a extends along center axes of the passage 2a and the internal space formed by the cylinder head 4 and the cylinder-shaped enclosure 9. The valve rod 6a has a thin portion and a thick portion which is closer to the spring seat 6c, wherein the thin and thick portions of the valve rod 6a are bounded by a stepped portion 6d.

The knock mechanism 5 comprises a rotational lock mechanism 8 and a lock operational mechanism 7 which are accommodated in the internal space formed by the cylinder head 4 and the cylinder-shaped enclosure 9. The lock operational mechanism 7 is positioned closer to the cylinder head 4 than the rotational lock mechanism 8. The rotational lock mechanism 8 and the lock operational mechanism 7 hold the valve rod 6a and are co-operated so as to displace the valve rod 6a along the center axis of the cylinder head 4 and the cylinder-shaped enclosure 9 by synchronizing with pushing operation of the cylinder-shaped enclosure 9 toward the work or the adsorption pad 1. The displacement of the valve rod 6a along the center axis of the cylinder head 4 and the cylinder-shaped enclosure 9 switches the valve 6 between the open and close states. The lock operational mechanism 7 has an axial part 7b which is engaged in the internal space of the cylinder head 4 and fixed to the cylinder head 4. The lock operational mechanism 7 also has a cylindrically shaped part 7c which is accommodated in the internal space of the cylinder-shaped enclosure 9. The cylindrically shaped part 7c has a circumferential outside wall, on which key grooves 7d are formed which extend in the axial direction of the cylinder-shaped enclosure 9. The cylinder-shaped enclosure 9 has a circumferential inside wall on which keys 9a are provided which extend in the axial direction of the cylinder-shaped enclosure 9 and project inwardly and diametrically, so that the keys 9a of the cylinder-shaped enclosure 9 are made into engagement with the key grooves 7d of the lock operational mechanism 7, thereby to restrict a relative rotational motion between the lock operational mechanism 7 and the cylinder-shaped enclosure 9. The lock operational mechanism 7 also has a ratchet 7a in one side of the cylindrically shaped part 7c, so that the ratchet 7a faces to the rotational lock mechanism 8. The rotational lock mechanism 8 has an axial portion 8b which has a smaller diameter than the cylindrically shaped part 7c of the lock operational mechanism 7, so that the axial portion 8b is allowed to be inserted into the cylindrically shaped part 7c of the lock operational mechanism 7. The rotational lock mechanism 8 has a cylindrically shaped part 8c which is accommodated in the internal space of the cylinder-shaped enclosure 9. The cylindrically shaped part 8c has a circumferential outside wall, on which key grooves 8d are formed which extend in the axial direction of the cylinder-shaped enclosure 9. As described above, the cylinder-shaped enclosure 9 has the circumferential inside wall on which the keys 9a are provided which extend in the axial direction of the cylinder-shaped enclosure 9 and project inwardly and diametrically, so that the keys 9a of the cylinder-shaped enclosure 9 are made into engagement with the key grooves 8d of the rotational lock mechanism 8, thereby to restrict a relative rotational motion between the rotational lock mechanism 8 and the cylinder-shaped enclosure 9. The rotational lock mechanism 8 also has a ratchet 8a in one side of the cylindrically shaped part 8c, so that the ratchet 8a faces to the ratchet 7a of the lock operational mechanism 7, whereby the ratchet 8a of the rotational lock mechanism 8 is allowed to be engaged with the ratchet 7a of the lock operational mechanism 7.

Operations of the above novel adsorption pen will be described. The novel adsorption pen is so operated to adsorb the work as shown in FIG. 4. The valve rod 6a is forced toward the lock operational mechanism 7 by the spring force of the coil spring member 13, whereby the step 6d of the valve rod 6a also forces the rotational lock mechanism 8 toward the lock operational mechanism 7. If the keys 9a of the cylinder-shaped enclosure 9 are not engaged with the key grooves 8*d* of the rotational lock mechanism 8, then the rotational lock mechanism 8 is inhibited to be moved toward the lock operational mechanism 7 even if the spring force is applied to the rotational lock mechanism 8. When the keys 9*a* of the cylinder-shaped enclosure 9 are engaged with the key grooves 8*d* of the rotational lock mechanism 8, so that the rotational lock mechanism 8 is allowed to be moved by the spring force by the coil spring member 13 toward the lock operational mechanism 7, whereby the ratchet 7*a* of the lock operational mechanism 7 is engaged with the ratchet 8*a* of the rotational lock mechanism 8, wherein the key grooves 8*d* serve as guides. Concurrently, the valve rod 6*a* is displaced toward the lock operational mechanism 7, whereby the valve 6 fixed to the valve rod 6*a* becomes apart from the valve seat 3, or the valve 6 is placed into the open state. As a result, the passage 2*a* is connected to the internal space of the adsorption pad 1. The passage 2*a* and the internal space of the adsorption pad 1 are at atmospheric pressure.

The cylinder-shaped enclosure 9 is forced toward the work with an exceeding force over the spring force by the first coil-spring member 12, then the first coil-spring member 12 is compressed to apply the spring force to the head 200, whereby the adsorption pad 1 is made to tightly contact with the work, and concurrently the bendable and contractible elastic portion 1*a* of the adsorption pad 1 is elastically deformed to be bent and contracted to reduce the internal volume of the adsorption pad 1. Since the ratchet 8*a* of the rotational lock mechanism 8 is engaged with the ratchet 7*a* of the lock operational mechanism 7, the motion of the rotational lock mechanism 8 toward the head 200 is inhibited. For this reason, if the cylinder-shaped enclosure 9 is further forced toward the work with the exceeding force over the spring force by the first coil-spring member 12, then the keys 9*a* of the cylinder-shaped enclosure 9 are made to slide along the key grooves 8*d* of the rotational lock mechanism 8, and engaged with the key grooves 7*d* of the lock operational mechanism 7 and further disengaged from the key grooves 8*d* of the rotational lock mechanism 8. Since the keys 9*a* of the cylinder-shaped enclosure 9 are disengaged from the key grooves 8*d* of the rotational lock mechanism 8, then the rotational lock mechanism 8 becomes free to allow rotational motion. Since the second coil-spring member 13 provides not only the spring force applied in the direction along the valve rod 6*a* or the axial direction of the cylinder-shaped enclosure 9 but also the rotational force around the axis of the cylinder-shaped enclosure 9, the rotational lock mechanism 8 is forced to be rotated by the second coil-spring member 13, whereby the ratchet 8*a* of the rotational lock mechanism 8 comes onto the edge of the keys 9*a* of the cylinder-shaped enclosure 9.

As shown in FIG. 5, the application of the external force to the cylinder-shaped enclosure 9 is discontinued, whereby the cylinder-shaped enclosure 9 is pushed up by the spring force by the first spring member 12. At this time, the ratchet 8*a* of the rotational lock mechanism 8 remains on the edge of the keys 9*a* of the cylinder-shaped enclosure 9. The ratchet 8*a* of the rotational lock mechanism 8 comes apart from the ratchet 7*a* of the lock operational mechanism 7 and the rotational lock mechanism 8 is moved up together with the upward motion of the cylinder-shaped enclosure 9. Since the valve rod 6*a* is fixed to the rotational lock mechanism 8, then the valve rod 6*a* with the valve 6 is moved up together with the upward motion of the rotational lock mechanism 8, whereby the valve 6 is made into contact tightly with the valve seat 3 or the valve 6 is placed into the close state. As a result, the passage 2*a* is separated by the valve 6 from the internal space of the adsorption pad 1. Concurrently, the bendable and contractible elastic portion 1*a* of the adsorption pad 1 as elastically deformed so bent and contracted to reduce the internal volume of the adsorption pad 1 is then returned to the original form thereby to increase the internal volume of the adsorption pad 1 without intake any air or an atmosphere. As a result, the pressure of the internal space of the adsorption pad 1 is reduced. This reduced pressure of the internal space of the adsorption pad 1 allows the adsorption pad 1 to securely adsorb the work.

The subsequent descriptions will focus on how to release the work from the adsorption pad 1. The cylinder-shaped enclosure 9 is again pushed toward the work with the exceeding force over the spring force by the first coil-spring member 12, then the first coil-spring member 12 is compressed to apply the spring force to the head 200, whereby the bendable and contractible elastic portion 1*a* of the adsorption pad 1 is again elastically deformed to be bent and contracted to again reduce the internal volume of the adsorption pad 1. As a result, the internal pressure of the adsorption pad 1 is again increased. The keys 9*a* of the cylinder-shaped enclosure 9 are engaged with the key grooves 7*d* of the lock operational mechanism 7, whereby the rotational motion of the cylinder-shaped enclosure 9 is inhibited. Further, the ratchet 8*a* of the rotational lock mechanism 8 is disengaged from the edge of the keys 9*a* of the cylinder-shaped enclosure 9, whereby the rotational lock mechanism 8 is made free to rotate around the center axis of the cylinder-shaped enclosure 9. Since the second coil-spring member 13 provides not only the spring force applied in the direction along the valve rod 6*a* or the axial direction of the cylinder-shaped enclosure 9 but also the rotational force around the axis of the cylinder-shaped enclosure 9, the rotational lock mechanism 8 is forced to be rotated by the second coil-spring member 13, whereby the keys 9*a* of the cylinder-shaped enclosure 9 are made engaged with the key grooves 8*d* of the rotational lock mechanism 8. As shown in FIG. 5, the application of the external force to the cylinder-shaped enclosure 9 is discontinued, whereby the cylinder-shaped enclosure 9 is pushed up by the spring force by the first spring member 12. Since the keys 9*a* of the cylinder-shaped enclosure 9 have already been engaged with the key grooves 8*d* of the rotational lock mechanism 8 and the rotational lock mechanism 8 is applied with the downward spring force by the second coil-spring member 13, the ratchet 8*a* of the rotational lock mechanism 8 comes engaged with the ratchet 7*a* of the lock operational mechanism 7. Since the valve rod 6*a* is fixed to the rotational lock mechanism 8, then the valve rod 6*a* with the valve 6 remains together with no motion of the rotational lock mechanism 8, whereby the valve 6 comes apart from the valve seat 3 or the valve 6 is placed into the open state. As a result, the passage 2*a* is connected to the internal space of the adsorption pad 1 whereby the internal pressure of the adsorption pad 1 is returned to the atmospheric pressure. As a result, the work is released from the adsorption pad 1.

It is also possible as a modification that a vacuum-formation mechanism may further be provided for forming a vacuum without utilizing the deformation of the bendable and contractible elastic portion 1*a*.

The above present invention provides the effects as described above. Once the adsorption pad 1 is made into contact securely with the work and pushes the work, so that the knock mechanism 5 places the valve 6 into the open state and the adsorption pad 1 is deformed to reduce the volume of the internal space of the adsorption pad 1, and subsequently the external force applied to the body 100 toward the work is discontinued, so that the knock mechanism 5 places the valve 6 into the close state and also the adsorption pad 1 is returned to the original form to increase the volume of the internal space of the adsorption pad 1, thereby to reducing the internal pressure of the adsorption pad 1, whereby the adsorption pad 1 adsorbs the work. Further, if the adsorption pad 1 again pushes the work, then the knock mechanism 5 places the valve 6 into the open state, so that the internal pressure of the adsorption pad 1 is returned to the atmospheric pressure, whereby the adsorption pad 1 releases the work. Namely, simple alternating operations of pushing the adsorption pen toward the work and making the adsorption pen free causes the knock mechanism 5 to switch the valve 6 between the close and open states to allow the adsorption pad 1 to adsorb and release the work. The above novel adsorption pen is improved in operability. This advantage in convenient operability is unlikely to cause miss-operations of the novel adsorption pen in adsorption and release to the work to be adsorbed such as wafers, pellets cut from a wafer and IC packages with sealed pellets. Namely, the novel adsorption pen is free from a possibility in miss-operation of the adsorption and release to the work, and it is impossible to drop the work and break the same.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. An adsorption tool for adsorbing and releasing an article comprising:

a contact head defining an internal space between said contact head and said article;

a body coupled to the contact head, said body comprising an enclosure member including an inner wall having plural projecting keys; and a pressure-adjuster in said adsorption tool for reducing an internal pressure of said internal space from an atmospheric pressure so that said contact head adsorbs said article due to a reduced internal pressure, and for returning said internal pressure of said internal space to the atmospheric pressure so that said contact head releases said article, said pressure-adjuster including a valve mechanism having a valve for switching said internal space between a closed-state when said internal space is at said reduced pressure, and an open-state when said internal space is at said atmospheric pressure, a knock mechanism connected to said valve mechanism for placing said valve mechanism into said closed and open states, a valve seat adjacent to said valve, and a valve rod terminating at said valve and held by said knock mechanism, said knock mechanism moving said valve to a first position apart from said valve seat and said knock mechanism moving said valve to a second position in contact with said valve seat, said knock mechanism comprising a rotational lock member having plural first key grooves for receiving said plural projecting keys and a first ratchet, said rotational lock member having a bottom portion engaging a stepped portion of said valve rod for receiving a force toward said first ratchet; a lock operational member having plural second key grooves for receiving said plural projecting keys and a second ratchet for engaging said first ratchet; a first coil-spring member between said contact head and said enclosure member for applying a first spring force to said enclosure member in an anti-parallel direction toward said contact head; and a second coil-spring member between a spring seat of said valve rod and a bottom of said enclosure member for applying a second spring force to said spring seat so that said stepped portion of said valve rod is forced toward said first ratchet.

2. The adsorption tool as claimed in claim 1, wherein said adsorption tool is a pen.

3. The adsorption tool as claimed in claim 1, wherein said contact head has an adsorption pad which has a bendable and contractible elastic portion which is deformable to reduce a volume of said internal space, and to reduce said internal pressure of said internal space when a pushing force toward the article is applied to said body.

4. A combination of an adsorption tool as claimed in claim 1 and an article, wherein the article is one of a wafer, a pellet cut from a wafer and an IC package having sealed pellets.

5. An adsorption tool for adsorbing and releasing an article comprising:

a contact head contacting the article for forming an internal space between said contact head and the article;

a body coupled with the contact head; and a pressure-adjuster accommodated in said adsorption tool for reducing an internal pressure of said internal space from an atmospheric pressure when a pushing force is applied to said body toward said article and subsequently removing said pushing force, so that said contact head adsorbs said article due to the reduced internal pressure, and for returning said internal pressure to the atmospheric pressure when said pushing force is reapplied to said body, so that said contact head releases said article, said pressure-adjuster comprising a valve mechanism for switching said internal space between a closed-state where said internal space is at the reduced pressure an open-state where said internal space is at said atmospheric pressure, and a knock mechanism connected to said valve mechanism for placing said valve mechanism into said closed-state, so that said contact head adsorbs said article and also for placing said valve mechanism into said open-state, so that said contact head releases said article, said valve mechanism comprising a valve seat at an inner-most part of said internal space, a valve adjacent to said valve seat, and a valve rod attached to and terminating at said valve and being held by said knock mechanism, said knock mechanism separating said valve from valve seat when the pushing force is applied to said body and said knock mechanism enabling said valve to contact said valve seat when said pushing force is removed.

6. The adsorption tool as claimed in claim 5, wherein said adsorption tool is a pen.

7. The adsorption tool as claimed in claim 5, wherein said contact head has an adsorption pad which has a bendable and contractible elastic portion which is deformable to reduce a volume of said internal space, and to reduce said internal pressure of said internal space when a pushing force toward the article is applied to said body.

8. An adsorption tool for adsorbing and releasing an article comprising:

a contact head defining an internal space between said contact head and said article;

a body coupled to the contact head, said body comprising an enclosure member including an inner wall having plural projecting keys; and a pressure-adjuster in said adsorption tool for reducing an internal pressure of said internal space from an atmospheric pressure so that said contact head adsorbs said article due to a reduced internal pressure, and for returning said internal pressure of said internal space to the atmospheric pressure so that said contact head releases said article, said pressure-adjuster including a valve mechanism having a valve for switching said internal space between a closed-state when said internal space is at said reduced pressure, and an open-state when said internal space is at said atmospheric pressure, a valve seat adjacent said valve, a means for placing said valve mechanism into said closed and open states and a valve rod terminating at said valve and held by said means for placing said valve mechanism, said means for placing said valve mechanism moving said valve to a first position apart from said valve seat and moving said valve to a second position in contact with said valve seat.

9. The adsorption tool as claimed in claim 8, wherein said adsorption tool is a pen.

10. The adsorption tool as claimed in claim 8, wherein said contact head has an adsorption pad which has a bendable and contractible elastic portion which is deformable to reduce a volume of said internal space, and to reduce said internal pressure of said internal space when a pushing force toward the article is applied to said body.

* * * * *